(12) United States Patent
Randive et al.

(10) Patent No.: US 6,789,789 B2
(45) Date of Patent: Sep. 14, 2004

(54) HIGH THROUGHPUT VAPORIZER

(75) Inventors: Rajul V. Randive, Pittsford, NY (US); William J. Messner, Mt. Morris, NY (US)

(73) Assignee: Veeco Instruments Inc., Woodbury, NY (US)

( * ) Notice: Subject to any disclaimer, the term of this patent is extended or adjusted under 35 U.S.C. 154(b) by 48 days.

(21) Appl. No.: 10/157,696

(22) Filed: May 29, 2002

(65) Prior Publication Data

US 2003/0222360 A1 Dec. 4, 2003

(51) Int. Cl.⁷ .................................................. B01F 3/04
(52) U.S. Cl. ...................... 261/133; 261/142; 261/147; 261/154; 261/DIG. 65; 118/726
(58) Field of Search ........................... 261/21, 94, 127, 261/133, 137, 142, 147, 148, 154, DIG. 65; 118/726

(56) References Cited

U.S. PATENT DOCUMENTS

| | | | |
|---|---|---|---|
| 5,835,677 A | 11/1998 | Li et al. | 392/401 |
| 5,835,678 A * | 11/1998 | Li et al. | 392/401 |
| 5,882,416 A | 3/1999 | Van Buskirk et al. | 118/726 |
| 6,169,852 B1 * | 1/2001 | Liao et al. | 392/395 |
| 6,277,201 B1 * | 8/2001 | Nishikawa | 118/726 |
| 2003/0116019 A1 * | 6/2003 | Torkaman | 95/226 |

* cited by examiner

Primary Examiner—Scott Bushey
(74) Attorney, Agent, or Firm—Brian B. Shaw, Esq.; Thomas B. Ryan; Harter, Secrest & Emery LLP

(57) ABSTRACT

A two-stage vaporizer includes two vaporizing stages joined by a vaporization chamber located gravitationally below the first vaporizing stage and gravitationally above the second vaporizing stage. A separator covering an outlet within the vaporization chamber allows vaporized precursor from both vaporizing stages to pass through the outlet to chemical vapor deposition system and prevents any remaining liquid precursor from passing through the outlet. The liquid precursor is premixed with carrier gas just prior to entry into the vaporizer. Additional flows of carrier gas pass through the two vaporizing stages in opposite directions to carry the vaporized precursor to the outlet.

15 Claims, 4 Drawing Sheets

HIGH THROUGHPUT VAPORIZER

TECHNICAL FIELD

Chemical vapor deposition (CVD) systems can be used to deposit thin films on substrates by decomposing vapor precursors within low-pressure reactors. The vaporization of the precursors takes place prior to entry of the precursors into the reactors.

BACKGROUND

Purified forms of metals, metal compounds, and other materials can be deposited in uniformly thin layers onto substrates by decomposing vaporized precursors of the materials. The depositions take place inside reactors with evacuatable environments and temperature controls. Many of the precursors take liquid form at ambient temperatures and are vaporized at higher temperatures just prior to entry into the reactors.

High deposition rates for such chemical vapor deposition (CVD) processes require correspondingly high delivery rates of vaporized precursors into the reactors. Vaporization of liquid precursors can be carried out by mixing the liquid precursor with a carrier gas or by atomizing the liquid precursor in a suspended gas. Liquid flow rates into vaporizers are limited by conversion capabilities of the vaporizers to vaporize the liquid precursors. Incomplete vaporization can result in the passage of large droplets of the liquid precursor into the reactors. The entry of liquid precursor into reactors, which is referred to as "flooding", contaminates the reactors and diminishes pumping performance. Flooding increases deposition processing time by requiring more time to evacuate the reactors.

SUMMARY OF INVENTION

Our invention provides opportunities for vaporizing liquid precursors at high rates and for delivering the vaporized precursors to low-pressure reactors for processing, while preventing the delivery of any remaining liquid precursor to the reactors. Droplets of liquid precursor remaining after a first stage of vaporization are trapped and subject to a second stage of vaporization. More efficient vaporization enables the higher rates of vaporization to be achieved. Throughput processing rates can also be improved by avoiding passage of liquid precursor droplets into the reactors.

One example of a precursor vaporizer for a chemical vapor deposition system has an inlet arrangement for admitting a liquid precursor and a carrier gas into the vaporizer. A first vaporizing stage vaporizes a portion of the liquid precursor into the carrier gas. A second vaporizing stage located gravitationally below the first vaporizing stage vaporizes another portion of the liquid precursor into the carrier gas. A vaporization chamber interconnects the first and second vaporizing stages. An outlet conveys the vaporized precursor from both vaporizing stages to a reactor of the chemical vapor deposition system. The outlet is connected to the vaporizing chamber out of liquid communication with the first vaporizing stage and extending gravitationally above the second vaporizing stage to prevent the remaining liquid precursor from reaching the reactor.

The inlet arrangement preferably includes separate conduits that support flows of carrier gas through both vaporizing stages towards the vaporization chamber. The flows of carrier gas supported by the inlet arrangement can include (a) a first flow of the carrier gas through the first vaporizing stage in a direction corresponding to a gravitationally directed seepage of the liquid precursor through the first vaporizing stage and (b) a second flow of the carrier gas through the second vaporizing stage in a direction opposed to a gravitationally directed seepage of the liquid precursor through the second vaporizing stage.

A separator within the vaporization chamber can be used to allow the liquid precursor to reach the second vaporizing stage and to allow the vaporized precursor to pass through the outlet. In addition, the separator can prevent the liquid precursor from passing through the outlet, preferably by diverting the liquid precursor from the outlet. For example, the separator can be formed as a roof over the outlet with pervious under-eaves structure for admitting the vaporized precursor under the roof.

The inlet arrangement also preferably includes a mixing valve that mixes the liquid precursor with the carrier gas in advance of the first vaporizing stage. The mixing valve regulates flow rates of the liquid precursor into the vaporizer. A signal from a flow meter to the mixing valve can be used to adjust the flow rates of the liquid precursor into the vaporizer.

The two vaporizing stages and the intermediate vaporizing chamber are preferably supported within a thermally conductive body that supports transfers of heat to the vaporization process. However, the mixing valve is preferably supported by a thermal isolator for insulating the mixing valve from the thermally conductive body. One or more heating elements positioned within the thermally conductive body heat the first and second vaporizing stages without substantially heating the mixing valve.

The second vaporizing stage preferably includes a trap for capturing the liquid precursor below a level of the outlet and a porous medium within the trap to increase surface area. A carrier gas passageway provides for conducting carrier gas through the porous medium to vaporize the liquid precursor captured in the trap. Preferably, the carrier gas passageway is arranged to convey the precursor vaporized by the second vaporizing stage in a direction opposed to gravity en route to the outlet in the vaporizing chamber.

During operation, the mixer preferably combines a liquid precursor with a carrier gas at a first temperature low enough to avoid significant decomposition of the liquid precursor. The first and second vaporizing stages promote vaporization of the liquid release agent at a second temperature high enough to avoid significant condensation of the vaporized precursor. The mixing is preferably carried out at ambient temperatures to prevent the mixing valve from becoming clogged with prematurely decomposed solids. The vaporizing stages, however, are preferably heated well above ambient temperatures to prevent condensation of the vaporized precursor.

A precursor for a low-pressure processing system can be vaporized in accordance with our invention by a series of steps for increasing vaporization efficiency and overall processing rates. A liquid precursor and a carrier gas are admitted into a vaporizer. A portion of the liquid precursor is vaporized into the carrier gas at a first vaporizing stage. A remaining liquid portion of the precursor from the first vaporizing stage is separated from the vaporized portion of the precursor. The remaining liquid portion of the precursor is passed to a second vaporizing stage. At least a portion and preferably all of the remaining liquid portion of the precursor are vaporized at the second vaporizing stage. The vaporized precursor from both vaporizing stages is passed through an outlet located gravitationally below the first vaporizing stage and gravitationally above the second vaporizing stage.

Preferably, the admission of the liquid precursor and the carrier gas includes mixing the liquid precursor with the carrier gas at a temperature low enough to avoid significant decomposition of the liquid precursor. Flow rates of the liquid precursor into the vaporizer can be regulated by a mixing valve that accepts a feedback signal from a flow meter. The mixing valve is preferably thermally isolated from the first and second vaporizing stages to conduct the mixing operation at ambient temperature.

Both vaporizing stages conduct flows of the carrier gas in opposite directions. The carrier gas is conducted through the first vaporizing stage in a direction corresponding to a gravitationally directed seepage of the liquid precursor through the first vaporizing stage and the carrier gas is conducted through the second vaporizing stage in a direction opposed to a gravitationally directed seepage of the liquid precursor through the second vaporizing stage.

The separation of the two states of the precursor between vaporizing stages preferably includes allowing the vaporized precursor from the first vaporizing stage to pass through the outlet and preventing the remaining liquid precursor from the first vaporizing stage from passing through the outlet. The liquid precursor remaining from the first vaporizing stage is preferably diverted from the outlet to the second vaporizing stage. The separation preferably takes place within a vaporization chamber interconnecting the two vaporizing stages. The vaporized precursor from both vaporizing stages preferably passes through the same outlet within the vaporizing chamber.

The remaining liquid portion of the precursor from the first vaporizing stage is captured in a trap at the second vaporizing stage below a level of the outlet. The carrier gas is preferably conducted through a porous medium within the trap to vaporize the liquid precursor captured in the trap. The carrier gas is flowed through the trap in a direction opposed to gravity en route to the outlet.

DRAWINGS

DETAILED DESCRIPTION

Figure 1:
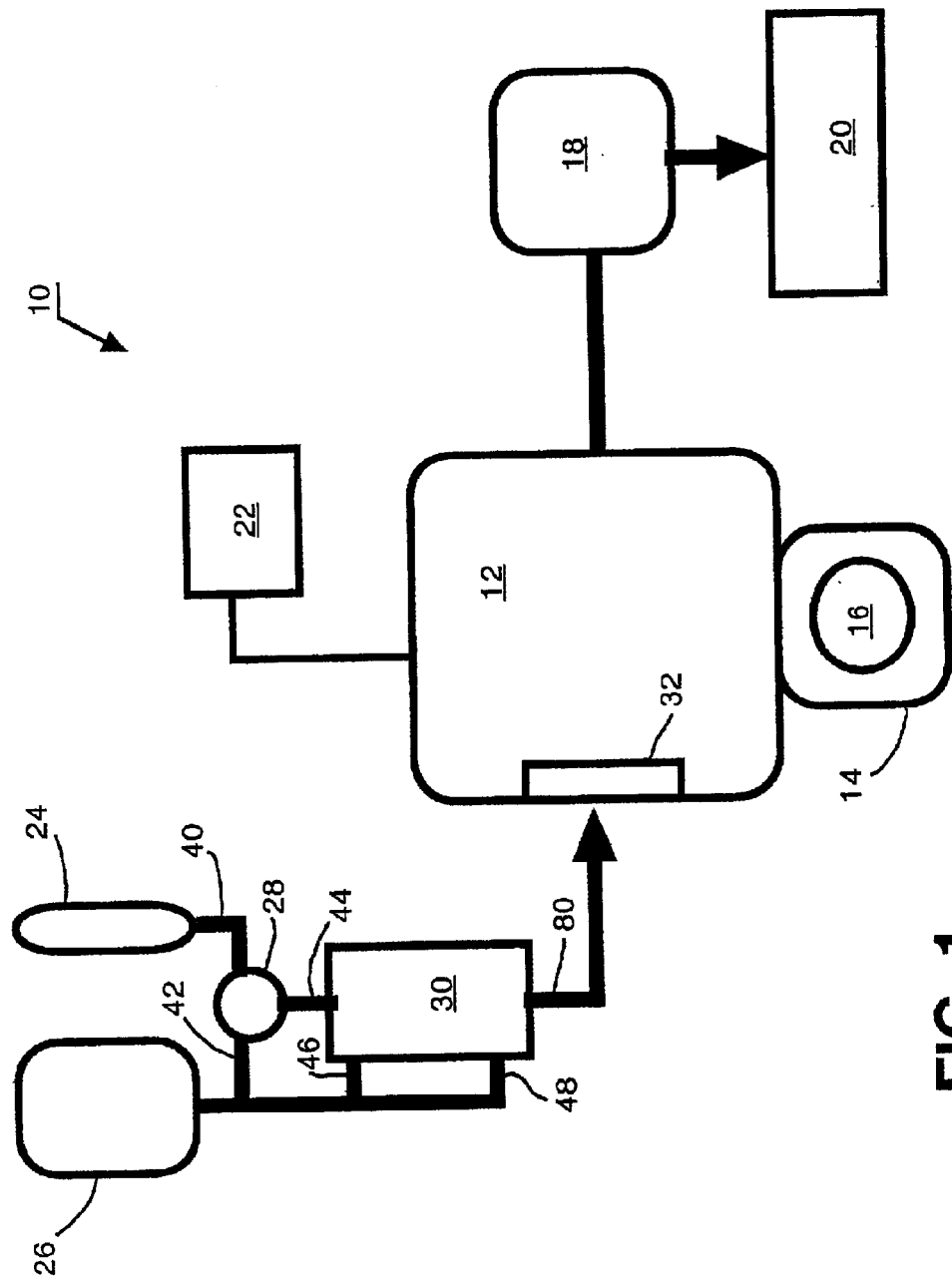
FIG. 1 is a diagram of an exemplary chemical vaporization system incorporating a vaporizer system arranged in accordance with our invention.

An exemplary chemical vapor deposition (CVD) system 10 useful for depositing thin layers of metal or other materials on substrates such as single-crystal substrates is depicted in FIG. 1. Thermochemical vapor-phase reactions necessary for forming the thin layers take place with a reactor 12 in the form of an evacuatable processing chamber. A handling system 14 moves substrates 16 (e.g., wafers) into and out of the reactor 12. An exhaust pump 18 evacuates gas from the reactor 12 for supporting low-pressure processing within the reactor 12. A waste treatment system 20 (e.g., an abatement module) safely manages the exhaust including byproducts of the reactions. A power supply 22 is regulated for temperature control and other powered functions of the reactor 12.

A supply 24 of liquid precursor containing constituents of the intended film and a supply 26 of a carrier gas are mixed together by a mixing valve 28 and delivered into a vaporizer 30. The carrier gas supply 26 is also connected directly to the vaporizer 30. Within the vaporizer, the liquid-phase precursor is converted into a vapor-phase precursor at an elevated temperature. The vaporized precursor is dispersed into the reactor 12 through a delivery manifold (e.g., an injector plate) 32 that functions as a diffuser. At a further elevated temperature within the reactor 12, the film constituents of the vaporized precursor deposit onto the substrate 16 according to a process of disproportionation.

A variety of liquid precursors can be used containing constituents including metal agents incorporated into metallorganic complexes for transportation in the vapor phase. Examples include PEMAT: Pentakis(ethylmethylamino) Tantalum, CUPRA SELECT: Hfac(Cu)TMVS, and Cobalt Tricarbonyl nitroso. An inert gas such as helium is preferably used as the carrier gas; but a variety of gases including argon, nitrogen, hydrogen, and oxygen can also be used.

Figure 2:
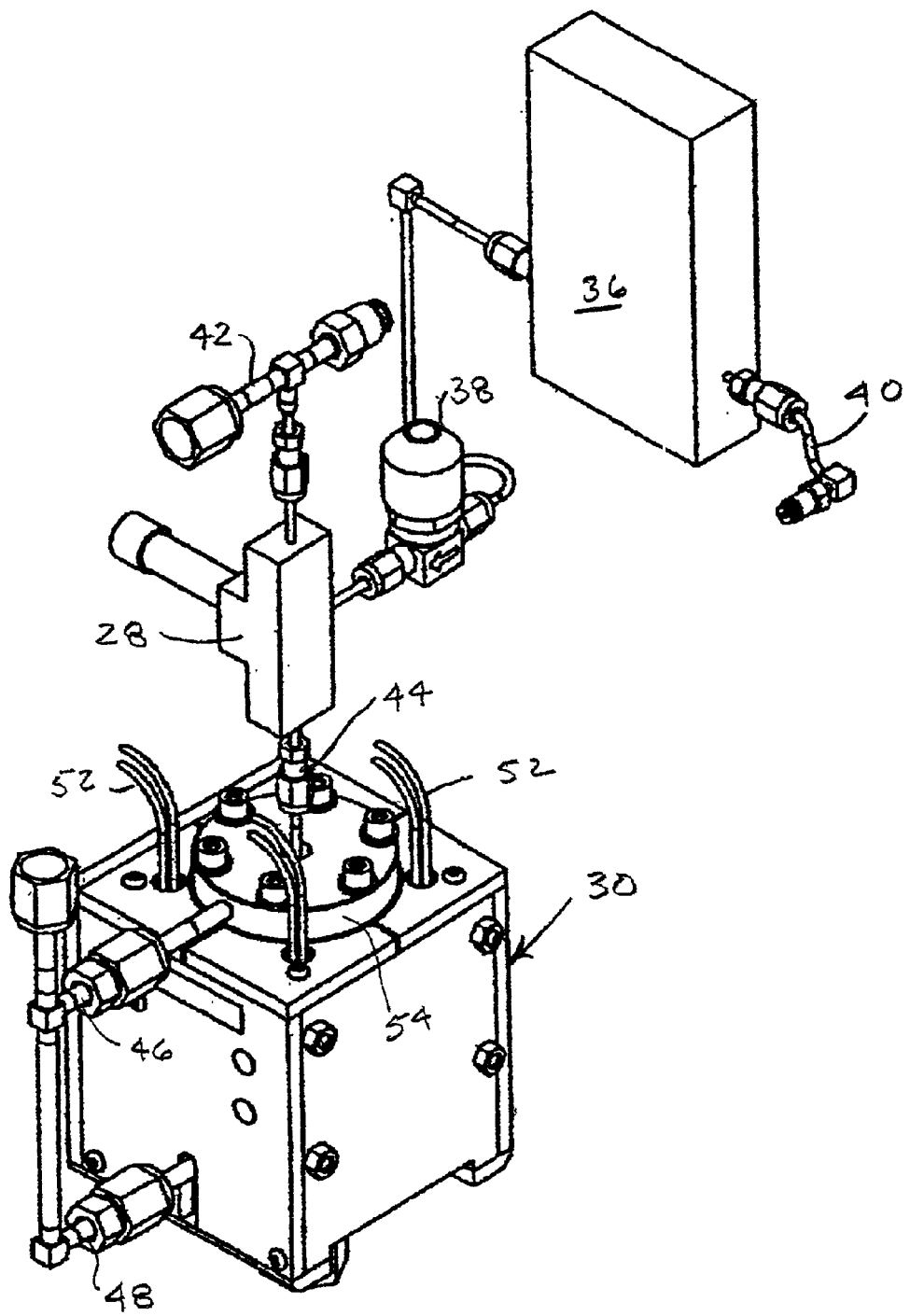
FIG. 2 is a perspective view of the vaporizer system showing more specific components of the system including a vaporizer, a mixing valve, a shut-off valve, and a flow meter.

A perspective exterior view of the mixing valve 28 and vaporizer 30 in FIG. 2 shows more specific components involved with vaporization. Just in advance of the mixing valve 28, the liquid precursor passes through both a flow meter 36 and a shut-off valve 38 along a liquid supply line 40. The mixing valve 28, which can be piezoelectrically actuated, receives a feedback signal from the flow meter 36 to control flow rates through the mixing valve 28. A separate gas supply line 42 conducts the carrier gas to the mixing valve 28. All of the liquid and gas regulating components including the mixing valve 28, the flow meter 36, and the shut-off valve 38 can be of conventional design for managing liquid flow rates of 0 through 5 cubic centimeters/min (ccm) and gas flow rates of 0 through 700 standard cubic centimeters per minute (sccm). Suitable components are available from Porter Instrument Company, Inc. of Hatfield, Pa.

Figure 3:
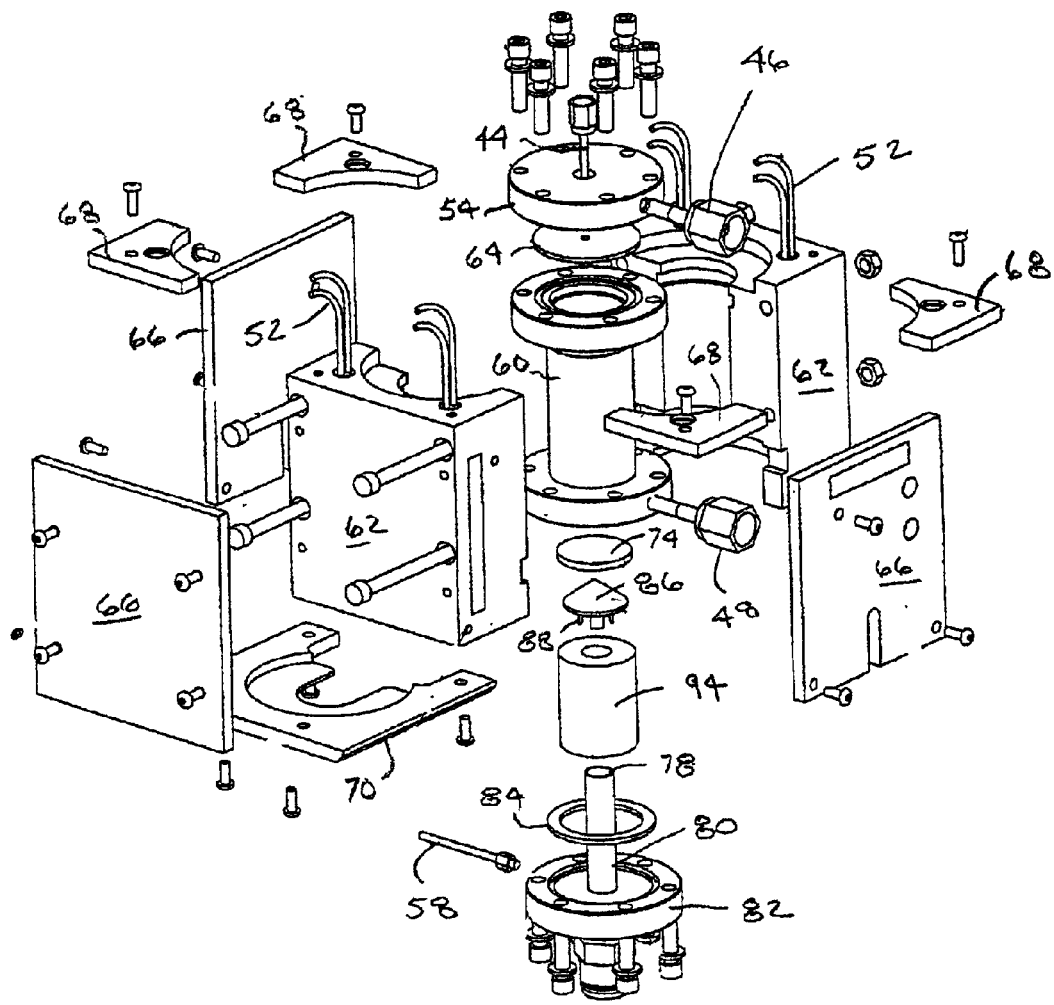
FIG. 3 is an exploded view of the vaporizer showing the various components of its assembly.
Figure 4:
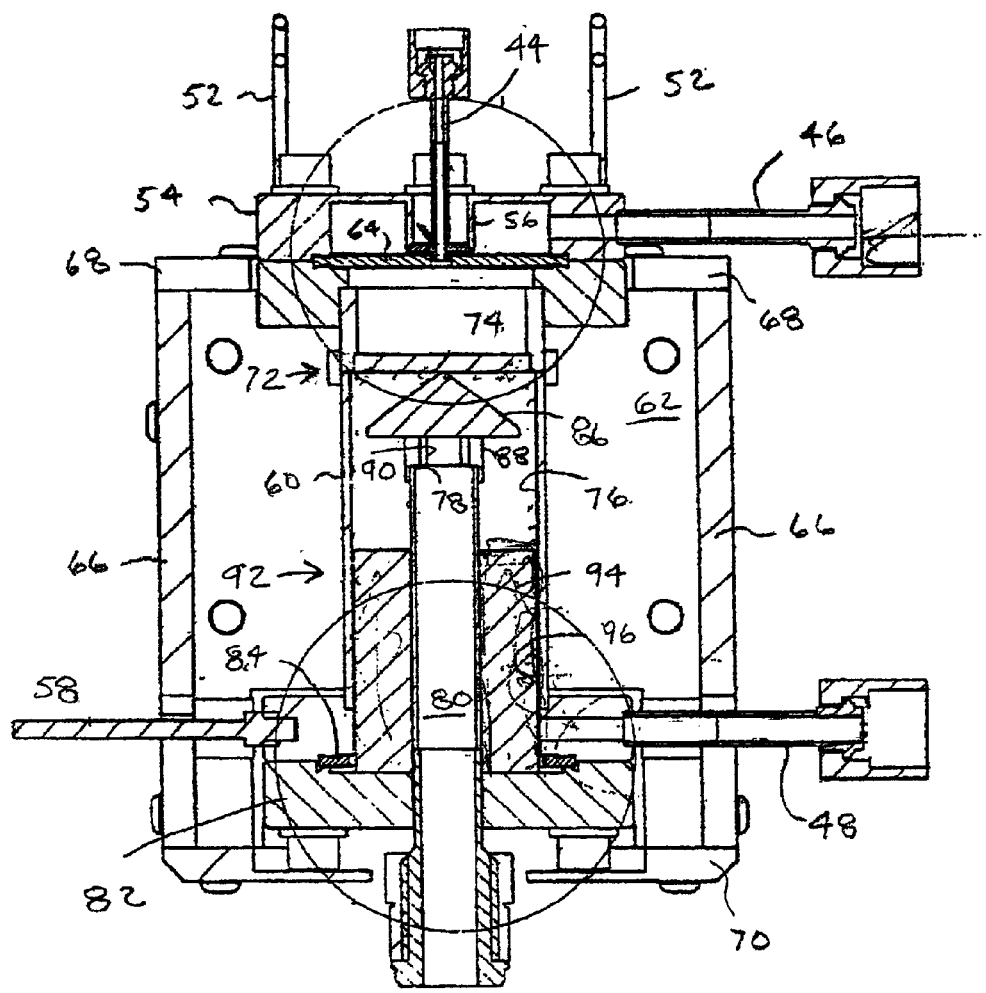
FIG. 4 is a side cross-sectional view of the vaporizer oriented as intended with respect to a vertical axis of gravity.

A delivery tube 44 conducts the pre-mixed liquid precursor and carrier gas into the vaporizer 30. Additional gas lines 46 and 48 conduct preheated carrier gas directly to two different locations within the vaporizer 30. Four sets of electrical lines 52 supply power to heating elements within the vaporizer 30. The heating elements, though not shown, are preferably 50 watt cartridge heaters; but a variety of other heating elements could also be used. Other interior structures of the vaporizer 30 can be seen in the exploded view of FIG. 3 and the cross-sectional view of FIG. 4.

The delivery tube 44 passes with wide clearance through a top flange 54 but is engaged with or itself terminates with a thermal isolator that limits transfers of heat from the vaporizer 30 to the delivery tube 44 and mixing valve 28. Thin walls 56 (see FIG. 4) of the flange 54 inhibit the conduction of heat to the delivery tube 44 from a vaporizer body 60 and a two-part surrounding block 62, which are both made of heat-conducting materials. The top flange 54, the vaporizer body 60, and other structural fittings that come into contact with the precursor are preferably made of stainless steel or other materials that are chemically inert to the precursor and support the use of metal seals. The two-part surrounding block 62, which is intended for supporting the heating elements, can be made of aluminum or other less expensive thermal conductors.

A copper gasket 64 seals the top flange 54 to a top of the vaporizer body 60, which itself has the form of a flanged-end pipe. However, a central hole in the gasket 64 permits (a) the premixed liquid precursor and carrier gas, which enter the top flange 54 through the delivery tube 44, and (b) additional preheated carrier gas, which enters the top flange 54 through the gas line 46, to both enter the vaporizer body 60. The heating elements (not shown) within the two-part surrounding block 62 provide for elevating the temperature of the vaporizer body 60 to support vaporization of the liquid precursor. A resistance temperature detector 58 monitors the temperature of the vaporizer body 60 to provide feedback control to the heating elements. Side insulating panels 66, together with top insulating panels 68 and bottom insulating panels 70, trap heat within the two-part surrounding block 62 to support more even heating of the vaporizer body 60.

Typically, the temperature of the vaporizer body 60 is raised with respect to an ambient temperature (approximately 24 degrees centigrade, ° C.) of the delivery tube 44 to between 55° C. and 65° C. for supporting and maintaining vaporization of the precursor. However, the preferred vaporization temperature can be varied in accordance with the vaporization characteristics of particular precursors.

A first vaporizing stage 72 within the vaporizer body 60 contains a porous frit 74 having a large surface area formed by voids and passages to facilitate vaporization of the liquid precursor. The frit 74 is made of an inert material, such as sintered nickel, to avoid chemically reacting with the precursor. Suitable frits are available from Mott Industrial. Passages through the frit 74 are sized large enough to allow the liquid precursor to seep through the frit 74 without pooling. The number and size of the passages and the overall dimensions (e.g., diameter and thickness) of the frit 74 are set to maximize surface area for vaporization while limiting pressure drops accompanying passage of vaporized precursor through the frit 74. The total pressure drop through the vaporizer is preferably less than 20 Torr.

The vaporized precursor transported by the flow of the preheated carrier gas through the frit 74 and any remaining liquid precursor moved in the same direction through the frit 74 by the force of gravity enter a vaporization chamber 76 within the vaporizer body 60. Within the vaporization chamber 76 is an opening 78 of an outlet tube 80 that extends through a bottom of the vaporizer body 60. The outlet tube 80 passes through a bottom flange 82 that is sealed to the bottom of the vaporizer body 60 through a copper gasket 84. An extension of the outlet tube 80 connects the vaporizer 30 to the delivery manifold 32 of the reactor 12.

A splash cone 86 forms a roof over the outlet opening 78 to prevent any of the remaining liquid precursor seeping through the frit 74 of the first vaporizing stage 72 from passing through the opening 78 of the outlet tube 80. However, the splash cone 86 is elevated on posts 88 above the outlet opening 78 to provide gaps 90 under eaves of the roof structure of the splash cone 86 for admitting the vaporized portion of the liquid precursor through the outlet opening 78.

The remaining liquid precursor that is diverted from the outlet opening 78 by the splash cone 86 descends through the vaporization chamber 76 to a second vaporizing stage 92 within the vaporizer body 60. Another frit 94, which is preferably more porous that the frit 74 but occupies more volume, exposes the remaining liquid precursor to a substantially increased surface area. The gas line 48 directs a flow of the preheated carrier gas opposed to the seepage direction of the remaining liquid precursor through the frit 94 for returning the remaining precursor in a vaporized form to the vaporization chamber 76. The flow of vaporized precursor from the second vaporizing stage 92 is combined with the flow of vaporized precursor from the first vaporizing stage 72 through the outlet opening 78 for delivery to the reactor 12.

The more porous frit 94 can be made of a less dense material such as aluminum foam and has an annular shape surrounding the outlet tube 80. A suitable media for the frit 94 is available from Energy Research and Generation, Inc. under the trade name DUOCELL.

The second vaporizing stage 92 occupies a trap 96 within the vaporizer body 60 for capturing the remaining liquid precursor below a level of the outlet opening 78. The trap 96 within the vaporizer body 60 is enclosed by the bottom flange 82 surrounding the outlet tube 80, which passes without interruption through the trap 96. The frit 94 fills the trap 96 to support vaporization of the liquid precursor captured within the trap 96. Any of the liquid precursor reaching the second vaporizing stage 92 remains captured within the trap 96 until transformed into a vapor state and transported by the preheated carrier gas into the vaporization chamber 76.

The vaporization process can be initiated by preheating the vaporizer body 30 and initiating flows from the precursor and carrier gas supplies 24 and 26. The mixing valve 28 combines the liquid precursor with the carrier gas at a first temperature low enough to avoid significant decomposition of the liquid precursor. Ambient temperature is usually adequate for this purpose. The premixed liquid precursor and carrier gas are kept at ambient temperature until the mixture is admitted into the vaporizer 30, which is preferably heated well above ambient temperatures (e.g., 55° C. to 65° C.) to promote vaporization and to avoid any subsequent condensation of the vaporized precursor. The temperature of the vaporizer 30, however, is kept well below the temperature required for decomposition of the precursor in the reactor 12.

The admission of the premixed liquid precursor and carrier gas into the vaporizer 30 is accompanied by the admission of additional carrier gas, which is preheated to promote immediate vaporization of the liquid precursor. Some of the liquid precursor may actually be vaporized even prior to reaching the porous frit 74 associated with the first vaporizing stage 72. However, the increased surface area provided by the frit 74 combined with the flow of preheated carrier gas through the frit 74 vaporizes a more significant portion of the liquid precursor.

The vaporized portion of the liquid precursor is transported by the carrier gas through the frit 74 in the same direction as the gravitationally directed seepage of the remaining portion of the liquid precursor through the frit 74. Both portions exit the frit 74 into the vaporization chamber 76 connecting the first and second vaporizing stages 72 and 92.

Within the vaporization chamber 76, the liquid portion of the precursor is separated from the vaporized portion of the precursor. The liquid portion descends into the second vaporizing stage 92, and the vaporized portion escapes through an outlet opening 78 for delivery to the reactor 12. The splash cone 86 positioned over the outlet opening 78 prevents the liquid portion of the precursor from entering the outlet opening 78. Any liquid precursor that would otherwise drip into the outlet opening 78 is diverted from the opening by the roof-like structure of the splash cone 86. However, gaps 90 formed by posts 88 that support the splash cone 86 above the outlet opening 78 admit the vaporized portion of the liquid precursor into the outlet pipe 80 through passages under the eaves of the roof-like splash cone 86.

The remaining liquid portion reaching the second vaporizing stage 92 continues to descend by gravitationally directed seepage through the frit 94. Although more porous than the frit 74, the frit 94 occupies substantially more volume to avoid becoming saturated by any temporary accumulations of the liquid precursor within the trap-like structure of the second vaporizing stage 92. The preheated carrier gas from the gas line 48 enters the trap 96 of the second vaporizing stage 94 near the bottom of the frit 94 and flows towards the vaporization chamber 76 in a direction opposed to the gravitationally directed seepage of the liquid precursor. The remaining precursor vaporized by the conditions of the second vaporizing stage 92 is transported by the oppositely directed carrier gas into the vaporization chamber 76 and combined with the precursor vaporized by the first vaporizing stage for escape through the common outlet opening 78 en route to the reactor 12.

The two vaporizing stages together with the premixing of the liquid precursor and carrier gas can increase vaporization efficiency and deposition rates. Overall processing time can be reduced by avoiding the passage of liquid precursor into the reactor 12.

Vaporization processing includes three main controls for regulating the concentration of precursor delivered to the reactor 12. These include the flow rate of the precursor, the flow rate of the carrier gas, and the temperature of the vaporizer body 30. Increased flow rates of the precursor can support higher deposition rates of the film constituents of the precursor within the reactor 12. For example, precursor flow rates of 1.5 ccm of a metallorganic compound of copper (CUPRA SELECT) together with carrier gas (helium) flow rates of 120 sccm can support copper deposition rates of around 1700 Angstroms per minute (A/min). The vaporizer 30 is expected to support precursor flow rates of 2.5 ccm or more without clogging.

Between deposition operations, the carrier gas can be left flowing through the vaporizer 30 to purge any fluids left within the vaporizer 30. The flow of liquid precursor is stopped by the shut-off valve 38. However, the flow of carrier gas can be maintained to purge the mixing valve 28 and delivery line 44. Both porous frits 74 and 94 can be replaced or cleaned on regular intervals.

The invention is expected to be especially useful for metallorganic chemical vapor deposition (MOCVD) operations used for such purposes as flat panel display manufacturing or thin film head production.

Although the invention has been illustrated with respect to a single embodiment, the invention can be practiced with a variety of other components and component configurations to achieve similar benefits. More than one of our new vaporizers can be used for supplying the same reactor with either multiple precursors or an increased amount of a single precursor along parallel delivery paths.

We claim:

1. A precursor vaporizer for a low-pressure processing system comprising:
   a mixer that combines a liquid precursor with a carrier gas at a first temperature low enough to avoid significant decomposition of the liquid precursor;
   first and second vaporizing stages that promote vaporization of the liquid precursor at a second temperature high enough to avoid significant condensation of the vaporized precursor; and
   an outlet located in between the first and second vaporizing stages in a position gravitationally below the first vaporizing stage and gravitationally above the second vaporizing stage for allowing the vaporized precursor from both vaporizing stages to pass through the outlet to the low-pressure processing system while preventing the liquid precursor reaching the second vaporizing stage from passing through the outlet.

2. The vaporizer of claim 1 further comprising first and second carrier gas conduits to the first and second vaporizing stages for conducting carrier gas through the first and second vaporizing stages in opposite directions.

3. The vaporizer of claim 2 in which the first carrier gas conduit conducts carrier gas through the first vaporizing stage in a direction corresponding to a gravitationally directed seepage of the liquid precursor through the first vaporizing stage and the second carrier gas conduit conducts carrier gas through the second vaporizing stage in a direction opposed to a gravitationally directed seepage of the liquid precursor through the second vaporizing stage.

4. The vaporizer of claim 1 in which the mixer includes a mixing valve that mixes the liquid precursor with the carrier gas in advance of the first vaporizing stage and that regulates flow rates of the liquid precursor through the mixer.

5. The vaporizer of claim 4 in which the mixing valve accepts a signal from a flow meter to adjust the flow rates of the liquid precursor into the vaporizer.

6. The vaporizer of claim 1 in which the mixer is thermally isolated from the first and second vaporizing stages.

7. The vaporizer of claim 6 further comprising:
   a thermally conductive body that supports the two vaporizing stages; and
   a heating element positioned within the thermally conductive body for heating the first and second vaporizing stages without substantially heating the mixer.

8. The vaporizer of claim 7 further comprising a thermal isolator mounted on the thermally conductive body for thermally isolating the mixer from the thermally conductive body.

9. The vaporizer of claim 1 further comprising:
   a vaporization chamber interconnecting the first and second vaporizing stages; and
   a separator within the vaporization chamber that allows the liquid precursor to reach the second vaporizing stage and that allows the vaporized precursor to pass through the outlet.

10. The vaporizer of claim 9 in which the separator prevents the liquid precursor from passing through the outlet.

11. The vaporizer of claim 10 in which the separator diverts the liquid precursor from the outlet.

12. The vaporizer of claim 11 in which the separator includes a roof over the outlet with eaves arranged for admitting the vaporized precursor under the roof.

13. The vaporizer of claim 1 in which the second vaporizing stage includes:
    a trap for capturing the liquid precursor below a level of the outlet;
    a porous medium within the trap to increase surface area; and
    a carrier gas passageway for conducting carrier gas through the porous medium to vaporize the liquid precursor captured in the trap.

14. The vaporizer of claim 13 in which the carrier gas passageway is arranged to convey the precursor vaporized by the second vaporizing stage in a direction opposed to gravity en route to the outlet.

15. The vaporizer of claim 1 in which the first vaporizing stage includes a first porous medium, the second vaporizing stage includes a second porous medium, and the second medium is more porous and occupies more volume than the first medium.

* * * * *